United States Patent
Imafuji et al.

(10) Patent No.: US 9,545,016 B2
(45) Date of Patent: Jan. 10, 2017

(54) WIRING SUBSTRATE AND METHOD FOR MANUFACTURING WIRING SUBSTRATE

(71) Applicant: SHINKO ELECTRIC INDUSTRIES CO., LTD., Nagano (JP)

(72) Inventors: Kei Imafuji, Nagano (JP); Noriyoshi Shimizu, Nagano (JP); Kiyoshi Ol, Nagano (JP); Hiromu Arisaka, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 51 days.

(21) Appl. No.: 14/675,819

(22) Filed: Apr. 1, 2015

(65) Prior Publication Data

US 2015/0305153 A1  Oct. 22, 2015

(30) Foreign Application Priority Data

Apr. 21, 2014 (JP) ................. 2014-087731
Oct. 16, 2014 (JP) ................. 2014-211905

(51) Int. Cl.
| H05K 7/10 | (2006.01) |
| H05K 3/40 | (2006.01) |
| H05K 1/02 | (2006.01) |
| H05K 3/24 | (2006.01) |
| H05K 3/34 | (2006.01) |

(52) U.S. Cl.
CPC ......... *H05K 3/4007* (2013.01); *H01L 2224/11* (2013.01); *H05K 1/0298* (2013.01); *H05K 3/244* (2013.01); *H05K 3/3436* (2013.01)

(58) Field of Classification Search
CPC .... H05K 3/244; H05K 3/3436; H05K 3/4007; H05K 2201/10734; H05K 2201/10787; H05K 2201/10909; H05K 1/111
USPC .................................. 361/767, 771
See application file for complete search history.

(56) References Cited

U.S. PATENT DOCUMENTS

| 7,008,867 | B2* | 3/2006 | Lei ................. H01L 24/03 257/E21.508 |
| 7,135,770 | B2* | 11/2006 | Nishiyama ............ H01L 21/563 228/164 |
| 7,417,326 | B2 | 8/2008 | Ikumo et al. |
| 8,232,193 | B2* | 7/2012 | Chang .................... H01L 24/11 257/737 |

(Continued)

FOREIGN PATENT DOCUMENTS

| JP | H04-196392 | 7/1992 |
| JP | 2007-173415 | 7/2007 |
| JP | 2010-098098 | 4/2010 |

*Primary Examiner* — Hoa C Nguyen
(74) *Attorney, Agent, or Firm* — IPUSA, PLLC

(57) ABSTRACT

A wiring substrate includes an insulating layer, and a connection terminal formed on the insulating layer. The connection terminal includes a metal layer formed on the insulating layer and including an upper surface, a metal post formed on the upper surface of the metal layer and including upper and side surfaces, and a surface plating layer that covers the upper and side surfaces of the metal post. The metal layer includes a material that is inactive with respect to a material included in the surface plating layer. The metal layer has an upper surface edge part that is exposed at an outside from the side surface of the metal post in a plan view. The surface plating layer is formed to expose the upper surface edge part of the metal layer.

8 Claims, 11 Drawing Sheets

(56) References Cited

U.S. PATENT DOCUMENTS

2008/0258299 A1\* 10/2008 Kang ..................... H01L 24/83
257/737

\* cited by examiner

WIRING SUBSTRATE AND METHOD FOR MANUFACTURING WIRING SUBSTRATE

CROSS-REFERENCE TO RELATED APPLICATIONS

This application is based upon and claims the benefit of priority of the prior Japanese Patent Application Nos. 2014-087731 and 2014-211905 filed on Apr. 21, 2014 and Oct. 16, 2014, the entire contents of which are incorporated herein by reference.

FIELD

The embodiments discussed herein are related to a wiring substrate and a method for manufacturing a wiring substrate.

BACKGROUND

There is known a semiconductor package having a semiconductor chip mounted on a wiring substrate by using solder. For example, in manufacturing the semiconductor package, solder may be applied to a connection terminal of the wiring substrate so that the connection terminal of the wiring substrate is connected to a connection terminal of the semiconductor chip byway of the solder. According to necessity, solder may also be applied to the connection terminal of the semiconductor chip.

A surface plating layer may be formed by performing an electroless nickel/gold plating process on a surface of the connection terminal of the wiring substrate (forming a gold plating layer on a front surface side of the connection terminal of the wiring substrate) for the purpose of, for example, improving wettability of solder. In a conventional wiring substrate, a solder resist layer is provided on the surface of the wiring substrate, and a connection terminal is exposed in an opening part formed in the solder resist layer. Because a surface plating layer need only be formed on the surface of the connection terminal exposed in the opening part, the surface plating layer rarely protrudes to an area beyond the connection terminal.

However, due to recent size-reduction and pitch-reduction of the semiconductor package, more semiconductor chips and wiring substrates are bonded to each other by bonding a connection terminal of the wiring substrate and the connection terminal of the semiconductor chip without applying solder on the connection terminal of the wiring substrate but by applying solder only to the connection terminal of the semiconductor chip. In a case of a conventional structure where the connection terminal is exposed in the opening part formed in the solder resist layer, the connection terminal of the wiring substrate may become recessed relative to the surface of the solder resist layer by not applying solder to the connection terminal of the wiring substrate. Thus, bonding the connection terminal of the semiconductor chip to the exposed connection terminal of the wiring substrate in a recessed state may be difficult in the case where solder is applied only to the connection terminal of the semiconductor chip.

Therefore, in a case of performing bonding by applying solder only to the side of the semiconductor chip, the connection terminal of the wiring substrate is to be formed projecting from the surface of the wiring substrate or formed to have its surface on the same plane as the surface of the wiring substrate. In this case, a surface plating layer is to be formed on an exposed connection terminal that is not covered by the solder resist layer (see, for example, Japanese Laid-Open Patent Publication No. 2010-98098).

However, in a case where an electroless nickel plating process is performed on the exposed connection terminal that is not covered by the solder resist layer, electroless nickel plating may protrude to an area between adjacent connection terminals of the wiring substrate and lead to short-circuiting between the adjacent connection terminals. Thus, reducing the pitch of the connection terminals is difficult.

In order to achieve pitch-reduction, it is possible to use a surface process method that does not form a nickel layer instead of using the electroless nickel plating process. For example, the surface process method may be an electroless gold plating process, an OSP (Organic Solderability Preservative) process, or an electroless palladium/gold plating process. However, in a case where solder containing tin is used to solder, for example, a semiconductor chip to a wiring substrate without a nickel layer formed on its surface, mutual diffusion between each connection terminal (e.g., copper) and the tin contained in the solder may be accelerated and lead to degradation of bonding reliability between the wiring substrate and the semiconductor chip.

As a process for preventing electroless nickel plating from protruding, there is a process of inactivating or removing a catalyst (e.g., palladium) which may cause the protruding of the electroless nickel plating. However, this process is insufficient for achieving pitch-reduction. This process may also prevent the electroless nickel plating from adhering on the wiring substrate or degrade its film quality due to an additive adhered on the surface of the wiring substrate during the process of removing the catalyst.

Thus, it is difficult for a conventional wiring substrate to achieve pitch-reduction of connection terminals while maintaining a reliable solder bonding performance.

SUMMARY

According to an aspect of the invention, there is provided a wiring substrate including an insulating layer, and a connection terminal formed on the insulating layer. The connection terminal includes a metal layer formed on the insulating layer and including an upper surface, a metal post formed on the upper surface of the metal layer and including upper and side surfaces, and a surface plating layer that covers the upper and side surfaces of the metal post. The metal layer includes a material that is inactive with respect to a material included in the surface plating layer. The metal layer has an upper surface edge part that is exposed at the outside from the side surface of the metal post in a plan view. The surface plating layer is formed to expose the upper surface edge part of the metal layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
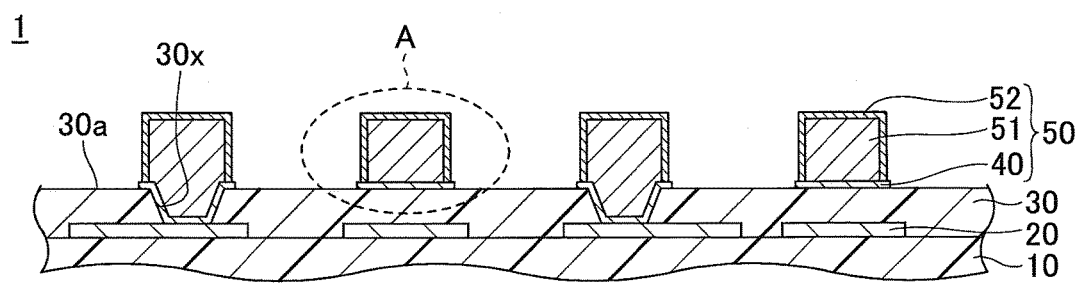
FIGS. 1A and 1B are schematic diagrams illustrating a part of a wiring substrate according to a first embodiment of the present invention.

Next, embodiments of the present invention are described with reference to the accompanying drawings. Throughout the drawings, like components/parts are denoted with like reference numerals. Thus, detailed descriptions of like components/parts denoted with like reference numerals are omitted.

First Embodiment

Structure of Wiring Substrate of First Embodiment

Figure 1B:
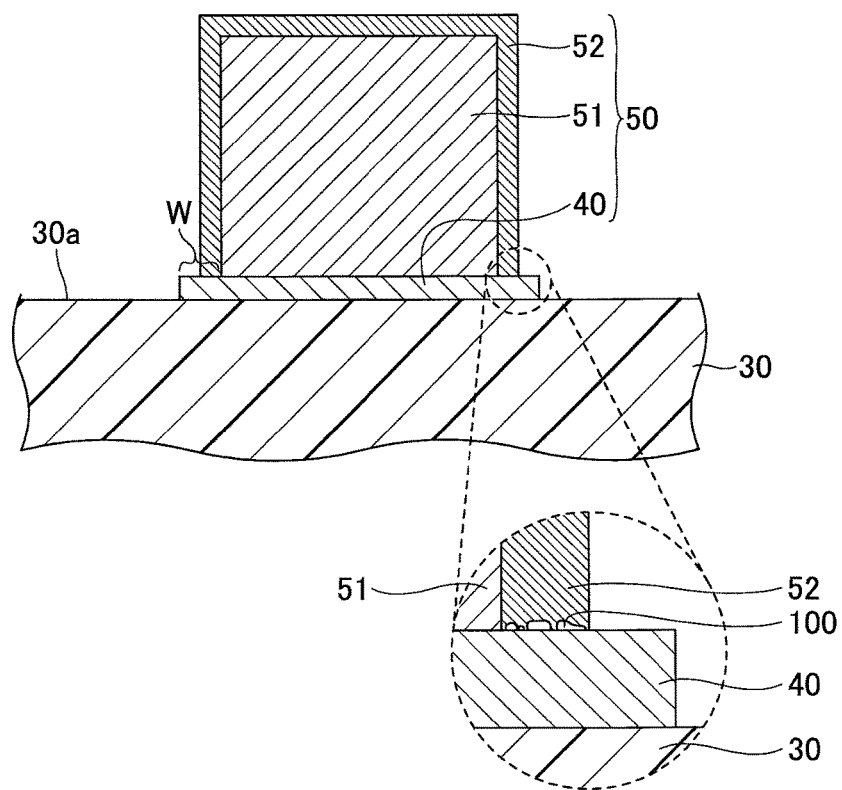

First, a structure of a wiring substrate 1 according to a first embodiment of the present invention is described. FIGS. 1A and 1B are cross-sectional views of a portion of the wiring substrate 1 of the first embodiment. FIGS. 1A and 1B illustrate the vicinity of an insulating layer 30 that is to be an outermost insulating layer of the wiring substrate 1 on one side of the wiring substrate 1. FIG. 1B is an enlarged view of area A illustrated in FIG. 1A.

With reference to FIGS. 1A and 1B, the wiring substrate 1 includes an insulating layer 10, a wiring layer 20, an insulating layer 30, and a connection terminal 50. Further, the connection terminal 50 includes a metal layer 40, a metal post 51, and a surface plating layer 52. Other layers such as another wiring layer, another insulating layer, a via wiring, or a core layer may be formed on a lower surface of the insulating layer 10. Further, a layer having resin as a main component, a layer having silicon as a main component, or a layer having ceramic as a main component may be formed on a lower surface of the insulating layer 10.

For the sake of convenience, in this embodiment, the side positioned toward the connection terminal 50 of the wiring substrate 1 (upper side in FIG. 1A) may be described as "upper side" or "one side" whereas the side positioned toward the insulating layer 10 of the wiring substrate 1 (lower side in FIG. 1A) may be described as "lower side" or "other side". Further, a surface of each part (element) positioned toward the side of the connection terminal 50 may be described as "upper surface" or "one surface" whereas a surface of each part (element) positioned toward the insulating layer 10 may be described as "lower surface" or "other surface". However, the wiring substrate 1 may be used in an upside down state or positioned at a given angle. Further, a "plan view" refers to observing an object from a direction of a line normal to an upper surface 30a of the insulating layer 30. Further, a "plan-view shape" of an object refers to a shape of the object observed from a direction of a line normal to the upper surface 30a of the insulating layer 30.

The insulating layer 10 is formed of, for example, an insulating resin having an epoxy type resin or a polyimide type resin as a main component. The insulating resin may be, for example, an insulating resin having a thermosetting property or a photosensitive property. The thickness of the insulating layer 10 may be, for example, approximately 20 µm to 45 µm. The insulating layer 10 may include a filler such as silica ($SiO_2$). Further, a build-up structure all of whose layers are made of thermosetting or photosensitive insulating resin may be provided below the insulating layer 10. Alternatively, a build-up structure having one layer made of thermosetting insulating resin and another layer made of a photosensitive resin may be provided below the insulating layer 10.

The wiring layer 20 is formed by performing a patterning process on the upper surface of the insulating layer 10, so that the wiring layer 20 is formed to have a predetermined plan-view shape. For example, copper (Cu) may be used as the material of the wiring layer 20. The thickness of the wiring layer 20 may be, for example, approximately 10 µm to 20 µm. The wiring layer 20 is connected to a wiring layer (not illustrated) below the wiring layer 20 by way of a via wiring (not illustrated) or the like.

The insulating layer 30 is formed on the upper surface of the insulating layer 10 to cover the wiring layer 20. The insulating layer 30 is an outermost layer of the wiring substrate 1 on the one side of the wiring substrate 1. The material and thickness of the insulating layer 30 may be, for example, the same as those of the insulating layer 10. The insulating layer 30 may include a filler such as silica ($SiO_2$).

The insulating layer 30 has a via hole 30x penetrating therethrough and exposing an upper surface of the wiring layer 20. The via hole 30x is open toward the upper surface 30a of the insulating layer 30 (opening part) and has a bottom surface formed by the upper surface of the wiring layer 20 (bottom part). The via hole 30x includes a recess part having a circular truncated cone shape in which the opening part of the via hole 30x has an area larger than the area of the bottom surface of the via hole 30x.

The metal layer 40 is continuously formed on the upper surface of the insulating layer 30, an inner wall surface of the via hole 30x, and the upper surface of the wiring layer 20 exposed in the via hole 30x. The metal layer 40 is a layer for ensuring, for example, the bond between the metal post 51 and the insulating layer 30. For example, titanium (Ti) may be used as the metal layer 40 to improve the bond between the insulating layer 30 and the copper (Cu) included in the metal post 51. The plan-view shape of the metal layer 40 may be, for example, a circular shape. In a case where the plan-view shape of the metal layer 40 has a circular shape, the diameter of the metal layer 40 may be, for example, approximately 5 µm to 50 µm.

The metal layer 40 may be made of a material that is inactive with respect to the material of the below-described surface plating layer 52. Alternatively, a material being inactive with respect to the material of the surface plating layer 52 and being less affinitive to solder than the surface plating layer 52 may be used to form the metal layer 40. For example, titanium (Ti) or chrome (Cr) may be used as the material of the metal layer 40. The thickness of the metal layer 40 may be, for example, approximately 10 nm to 500 nm. The technical significance of selecting the aforementioned materials as the metal layer is described below.

The connection terminal 50 is a projecting electrode that is formed to project from the upper surface 30a of the insulating layer 30. The connection terminal 50 can be electrically connected to an electronic component such as a semiconductor chip. The connection terminal 50 includes the metal layer 40, the metal post 51 formed on the upper surface of the metal layer 40 as the body of the connection terminal 50, and the surface plating layer 52 covering the upper and side surfaces of the metal post 51. The metal post 51 may have a structure including an electroplating layer 51b layered on a seed layer 51a (see, for example, FIG. 5A). For example, copper (Cu) may be used as the material of the seed layer 51a and the electroplating layer 51b. For example, a known semi-additive method may be used to form the metal post 51. Alternatively, a known subtractive method may be used to form the metal post 51.

An upper surface outer edge part W of the metal layer 40 is exposed to form a ring shape at the outside from the side surface of the metal post 51 in a plan view. For example, in a case where the plan-view shapes of the metal layer 40 and the metal post 51 both have circular shapes, the upper surface edge part W of the metal layer 40 is exposed to form a circular ring shape at the outside from the side surface of the metal post 51 in a plan view. The width of the upper surface outer edge part W of the metal layer 40 may be, for example, approximately 0.2 μm to 3 μm. The thickness of the metal post 51 (the thickness of only the part of the metal post 51 above the upper surface of the metal layer 40 and excluding the thickness of the part of the metal post 51 inside the via hole 30x) may be, for example, approximately 2 μm to 15 μm. The metal post 51 is formed to have a plan-view shape that is smaller than the plan-view shape of the metal layer 40. For example, in a case where the plan-view shape of the metal layer 40 is a circular shape, the metal post 51 may be formed to have a smaller diameter than the diameter of the plan-view shape of the metal layer 40. The pitch of the metal posts 51 may be, for example, approximately 20 μm to 50 μm.

The surface plating layer 52 is formed covering an inner peripheral side of the upper surface outer edge part W while exposing an outer peripheral side of the upper surface outer edge part W in a plan view. For example, the inner peripheral side (inner peripheral surface) of the upper surface outer edge part W is a side (surface) of the upper surface outer edge part W at which the metal post 51 is positioned whereas the outer peripheral side (outer peripheral surface) of the upper surface outer edge part W is a side (surface) of the upper surface outer edge part W that is positioned more outward than the inner peripheral side (inner peripheral surface) of the upper surface outer edge part W. That is, the film thickness of the surface plating layer 52 is less than the width of the upper surface outer edge part W of the metal layer 40.

However, as described above, the deposition of the surface plating layer 52 on the surface of the metal layer 50 is to be restrained, so that the metal layer 40 is inactive with respect to the material included in the upper surface layer 52. Therefore, although the surface plating layer 52 may be deposited on a part of the surface of the metal layer 40, the surface plating layer 52 cannot be grown to form a continuous film on the surface of the metal layer 40.

For the sake of convenience, FIG. 1B illustrates the inner peripheral side of the upper surface outer edge part W of the metal layer 40 continuously contacting an end part of the surface plating layer 52. However, when viewed in units of microns, the inner peripheral side of the upper surface outer edge part W of the metal layer 40 and the end part of the surface plating layer 52 partly (sparsely) contact each other and do not continuously contact each other. That is, a fine cavity or cavities 100 are formed at an area(s) where the inner peripheral side of the upper surface outer edge part W of the metal layer 40 and the end part of the surface plating layer 52 face each other. In other words, a fine space or spaces are formed at an area(s) where the inner peripheral surface of the upper surface outer edge part W and the end part of the surface of the surface plating layer 52 do not contact each other. Therefore, the adhesive strength between the metal layer 40 and the surface plating layer 52 is significantly less than the adhesive strength between the metal post 51 and the surface plating layer 52.

The surface plating layer 52 may be, for example, a nickel/gold (Ni/Au) layer (metal layer including a Ni layer and a Au layer layered in this order on the upper and side surfaces of the metal post 51), or a nickel/palladium/gold (Ni/Pd/Au) layer (i.e. metal layer including a Ni layer, a Pd layer, and a Au layer layered in this order on the upper and side surfaces of the metal post 51). Further, an electroplating method or an electroless plating method may be used to form the surface plating layer 52. A nickel alloy may be used instead of using nickel to form the surface plating layer 52. The nickel alloy may be, for example, nickel phosphorous (Ni—P) or nickel boron (Ni—B).

Figure 2:
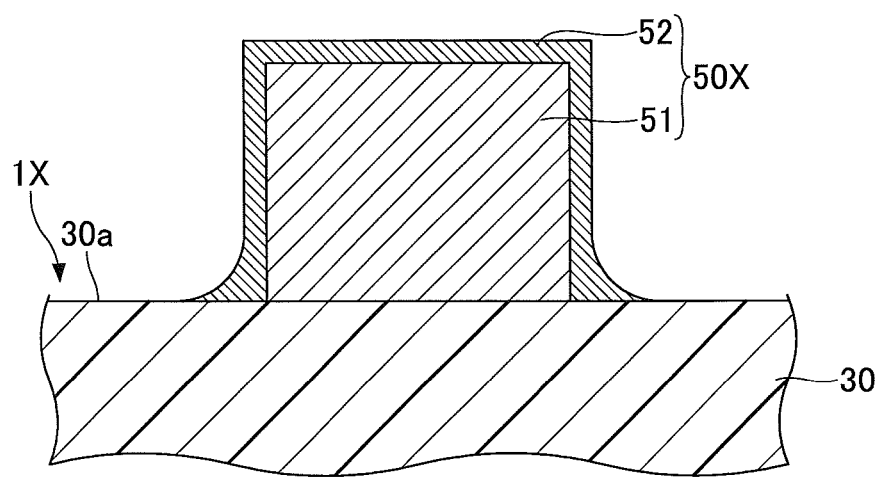
FIG. 2 is a cross-sectional view illustrating a part of a wiring substrate of a comparative example.

FIG. 2 is a cross-sectional view illustrating a part of a wiring substrate of a comparative example. FIG. 2 corresponds to the cross-sectional view of FIG. 1B. Unlike the wiring substrate 1, the wiring substrate 1X of FIG. 2 has a connection terminal 50X formed on the upper surface 30x of the insulating layer 30. The connection terminal 50X includes the metal post 51 and the surface plating layer 52 but does not include the metal layer 40. That is, the metal layer 40 including a material that is inactive to a material of the surface plating layer 52 is not disposed between the insulating layer 30 and the connection terminal 50X.

Because the wiring substrate 1X is formed without the metal layer 40, the deposition of the surface plating layer 52 on the upper surface 30a of the insulating layer 30 cannot be restrained. Thus, a bottom hem of the surface plating layer 52 (a part of the surface plating layer 52 on the side of the upper surface 30a of the insulating layer 30) may extend (protrude) to another adjacent connection terminal 50X on the upper surface 30a of the insulating layer 30. As a result, in a case where connection terminals 50x are adjacently arranged on the wiring substrate 1X, the bottom hems of the surface plating layers 52 that protrude on the upper surface 30a of the insulating layer 30 may cause short-circuiting between the adjacent connection terminals 50x. Therefore, reducing the pitch between the connection terminals 50x is difficult.

In another comparative example in which the metal layer 40 and the metal post 51 are formed with the same diameter, only a side surface of the metal layer 40 becomes exposed. However, it is difficult to restrain the deposition of the surface plating layer 52 merely with the side surface of the metal layer 40 having only a nanometer-unit thickness. This may lead to short-circuiting between adjacent connection terminals 50x.

The phenomenon of the bottom hem of the surface plating layer 52 (FIG. 2) extending to an adjacent connection terminal 50X can be explained as below. For example, in a case where the surface plating layer 52 is formed of an electroless nickel plating, a reaction inhibitor is added into the electroless nickel plating. If a large amount of reaction inhibitor is added, an inhibiting effect may be too strong in an area where the flow rate of the electroless nickel plating is high and prevent a plating reaction from occurring. Therefore, a small amount of reaction inhibitor is added to the electroless nickel plating. However, as the pitch between the connection terminals 50X becomes smaller, the flow rate of the electroless nickel plating becomes slower at an area of the bottom hem of the connection terminal 50X. The inhibiting effect of the reaction inhibitor becomes weaker as the flow rate of the electroless nickel plating becomes slower. As a result, the electroless nickel plating included in the surface plating layer 52 protrudes at the bottom hem of the connection terminal 50X and extends to another adjacent connection terminal 50X.

In contrast, with the wiring substrate (see FIGS. 1A and 1B) of the first embodiment, the metal layer 40 including a material that is inactive with respect to the material included in the surface plating layer 52 is disposed between the insulating layer 30 and the surface plating layer 52. Thereby, even in a case where the flow rate of a plating liquid becomes slow at the bottom hem of the connection terminal 50 and the inhibiting effect of the reaction inhibitor is weakened by the slowing of the plating liquid, the deposition of the surface plating layer 52 can be restrained at the surface of the metal layer 40. Therefore, the bottom hem of the surface plating layer 52 can be prevented from extending (protruding) to another adjacent connection terminal 50 on the upper surface 30a of the insulating layer 30. Thus, the wiring substrate 1 of the first embodiment enables the pitch of connection terminals 50 to be further reduced compared to the wiring substrate 1X of the comparative example.

<Method for Manufacturing Wiring Substrate of First Embodiment>

Next, a method for manufacturing a wiring substrate according to the first embodiment of the present invention is described. FIGS. 3A-5C are schematic diagrams illustrating the processes for manufacturing the wiring substrate of the first embodiment. First, a known method is used to form the wiring layer 20 and the insulating layer 30 on the insulating layer 10 and form the via hole 30x exposing the upper surface of the wiring layer 20 in the insulating layer 30. The materials and thicknesses of the wiring layer 20 and the insulating layers 10, 30 have been described above. The via hole 30x may be formed by, for example, a laser processing method using a $CO_2$ laser or the like. In a case where the via hole 30x is formed by the laser processing method, it is preferable to perform a desmearing process for removing residual resin of the insulating layer 30 adhered to the upper surface of the wiring layer 20 exposed in the bottom part of the via hole 30x. In this case, a desmearing process may be used to remove the residual resin of the insulating layer 12. However, in a case where the metal layer 40 is formed by using a sputtering method in the below-described process of FIG. 3B, the desmearing process need not be performed on the via hole 30x. Thus, the manufacturing process can be simplified.

Alternatively, the via hole 30x may be formed by using a photolithographic method. For example, a photosensitive insulating resin may be used as the material of the insulating layer 30 to form the via hole 30x with the photolithographic method. By using the photolithographic method, the opening of the via hole 30x on the side of the upper surface 30a of the insulating layer 30 can be formed with a small diameter. Therefore, the photolithographic method is preferable from the aspect of achieving size reduction of the connection terminal in a case of forming the connection terminal 50 directly above the via hole 30x.

Figure 3A:
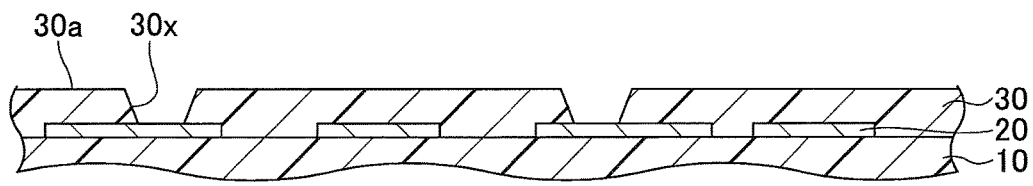
FIGS. 3A-3C are schematic diagrams illustrating processes for manufacturing the wiring substrate according to the first embodiment of the present invention (part 1)
Figure 3B:
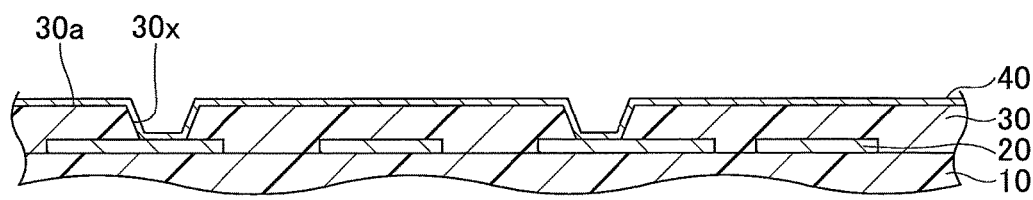

Then, in the process illustrated in FIG. 3B, the metal layer 40 is formed by using, for example, a sputtering method or an electroless plating method. The metal layer 40 continuously covers the upper surface 30a of the insulating layer 30, an inner wall surface of the via hole 30x, and the upper surface of the wiring layer 20 exposed in the via hole 30x. The material of the metal layer 40 may be a material that is inactive with respect to the material of the surface plating layer 52. Alternatively, a material being inactive with respect to the material of the surface plating layer 52 and being less affinitive to solder than the surface plating layer 52 may be used to form the metal layer 40. For example, titanium (Ti) or chrome (Cr) may be used as the material of the metal layer 40. The thickness of the metal layer 40 may be, for example, approximately 10 nm to 500 nm. In this embodiment, titanium is used as the material of the metal layer 40.

Figure 3C:
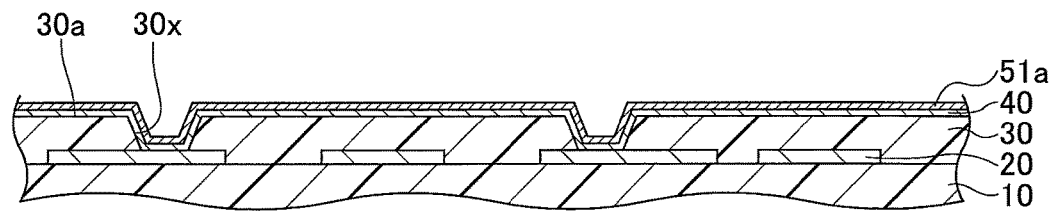

Then, in the process illustrated in FIG. 3C, a seed layer 51a is formed on the metal layer 40 by using, for example, a sputtering method or an electroless plating method. For example, copper (Cu), nickel (Ni), or a copper/nickel alloy (Cu—Ni) may be used as the material of the seed layer 51a. The thickness of the seed layer 51a may be, for example, approximately 100 nm to 300 nm. Because the metal layer 40 made of titanium is formed below the seed layer 51a, a satisfactory adhesive strength between the insulating layer 30 and the seed layer 31a can be attained. In this embodiment, copper is used as the material of the seed layer 51a.

Figure 4A:
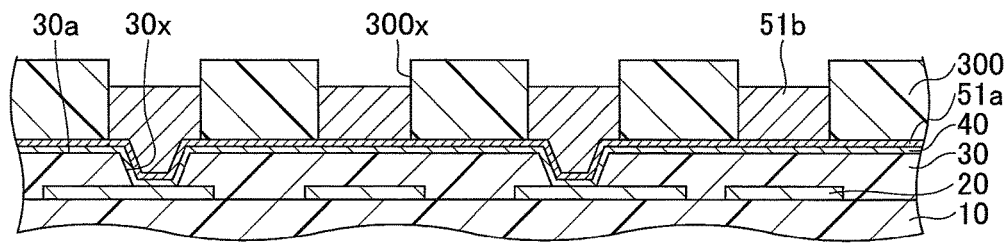
FIGS. 4A-4C are schematic diagrams illustrating processes for manufacturing the wiring substrate according to the first embodiment of the present invention (part 2)

Then, in the process illustrated in FIG. 4A, a resist layer 300 including an opening part 300x corresponding to the metal post 51 is formed on the seed layer 51a. Then, an electroplating layer 51b is formed on the seed layer 51a exposed in the opening part 300x of the resist layer 300. The electroplating layer 51b is formed with an electroplating method using the seed layer 51a as a power-feeding layer. In this embodiment, copper is used as the material of the electroplating layer 51b.

Figure 4B:
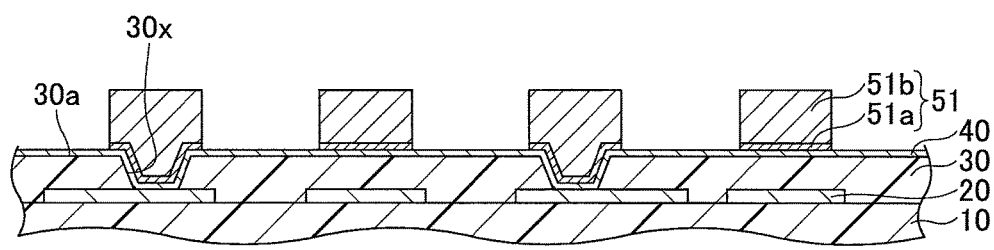

Then, in the process illustrated in FIG. 4B, the seed layer 51a is removed after the removal of the resist layer 300 of FIG. 4A. The removal of the seed layer 51a is performed by etching the seed layer 51a that is not covered by the electroplating layer 51b used as a mask. For example, an etching liquid such as sulfuric acid/hydrogen peroxide or persulfuric acid salt may be used, so that only the seed layer 51a formed of copper can be selectively etched without removing the metal layer 40 formed of titanium. Alternatively, a dry process such as a plasma process may be used to remove the seed layer 51a. Thereby, the metal post 51 having the electroplating layer 51b formed on the seed layer 51a can be formed. The metal post 51 may be formed on a portion of the insulating layer 30 in which the via hole 30x is formed or on a flat portion of the upper surface 30a of the insulating layer 30 in which the via hole 30x is not formed.

The thickness of the metal post 51 (the thickness of only the part of the metal post 51 above the upper surface of the metal layer 40 and excluding the thickness of the part of the metal post 51 inside the via hole 30x) may be, for example, approximately 2 μm to 15 μm. The plan-view shape of the metal post 51 may be, for example, a circular shape. The pitch of the metal posts 51 may be, for example, approximately 20 μm to 50 μm.

Figure 4C:
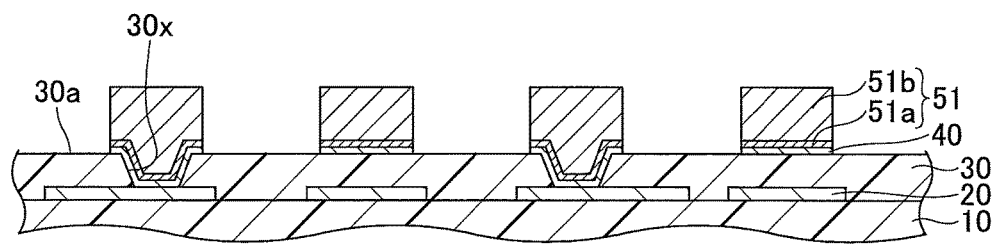

Then, in the process illustrated in FIG. 4C, the part of the metal layer 40 that is not covered by the metal post 51 is removed by etching. For example, a hydrofluoric acid may be used as an etching liquid, so that only the metal layer 40 formed of titanium can be selectively etched without removing the seed layer 51a and the electroplating layer 51b formed of copper.

The metal layer 40 includes a portion formed on the upper surface 30a of the insulating layer 30 and a portion connected to the wiring surface 20 that is continuously formed from the upper surface of the insulating layer 30 to the upper surface of the wiring layer 20 exposed in the via hole 30x by way of the inner wall surface of the via hole 30x.

Figure 5A:
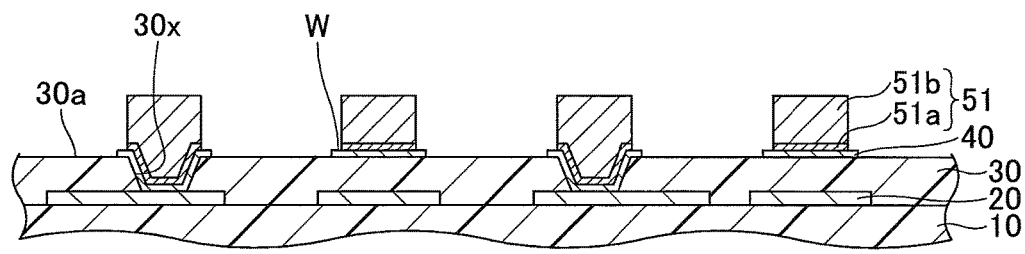
FIGS. 5A-5C are schematic diagrams illustrating processes for manufacturing the wiring substrate according to the first embodiment of the present invention (part 3)

Then, in the process illustrated in FIG. 5A, the periphery of the metal post 51 of FIG. 4C is etched approximately 0.2 μm to 3 μm. Thereby, the upper surface outer edge part W having a ring shape is exposed at the outside from the side surface of the metal post 51 in a plan view. In a case where the plan-view shapes of the metal layer 40 and the metal post 51 are circular shapes, the upper surface outer edge part W having a circular ring shape is exposed at the outside from the side surface of the metal post 51 in a plan view. For example, an etching liquid such as sulfuric acid/hydrogen peroxide or persulfuric acid salt may be used to etch the metal post 51 including the seed layer 51a and the electroplating layer 51b.

Figure 5B:
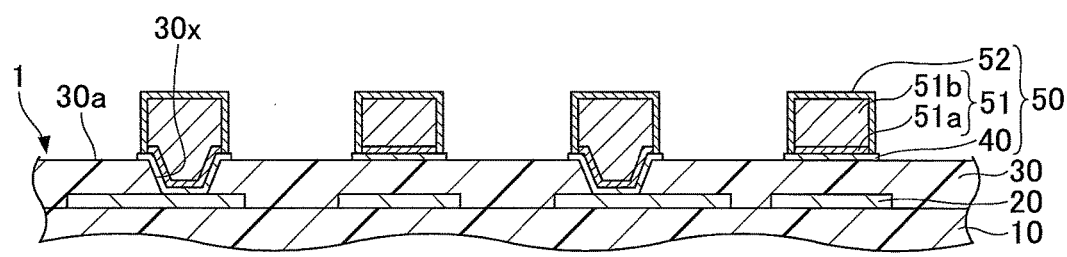

Then, in the process illustrated in FIG. 5B, the surface plating layer 52 covering the upper and side surfaces of the metal post 51 is formed by using, for example, an electroless plating method. Thereby, the connection terminal 50 including the metal layer 40, the metal post 51 (including the seed layer 51a and the electroplating layer 51b), and the surface plating layer 52 is formed. Thereby, the manufacturing of the wiring substrate 1 is completed.

In this embodiment, the surface plating layer 52 is formed so that the outer peripheral side of the metal layer 40 is exposed in the inner peripheral side of the upper surface outer edge part W of the metal layer 40 in a plan view. That is, the surface plating layer 52 is formed so that the film thickness is less than the width of the upper surface outer edge part W of the metal layer 40. The surface plating layer 52 may be, for example, a nickel/gold (Ni/Au) layer (metal layer including a Ni layer and a Au layer layered in this order on the upper and side surfaces of the metal post 51), of a nickel/palladium/gold (Ni/Pd/Au) layer (i.e. metal layer including a Ni layer, a Pd layer, and a Au layer layered in this order on the upper and side surfaces of the metal post 51).

For example, in a case of forming a nickel/gold layer as the surface plating layer 52 by using an electroless plating method, a nickel/phosphorous (Ni—P) plating type using a hypophosphorous acid as a reducing agent may be used. Although catalytic activity using palladium is required to occur in the nickel/phosphorous plating so that nickel is deposited on the surface of the metal post 51 formed of copper, nickel is not deposited on the surface of the metal layer 40 because catalytic activity does not occur in the metal layer 40 formed of titanium. That is, titanium is inactive with respect to nickel. Therefore, nickel can be prevented from being deposited on the surface of the metal layer 40 formed of titanium, and nickel plating can be prevented from protruding on the upper surface 30a of the insulating layer 30.

Figure 5C:
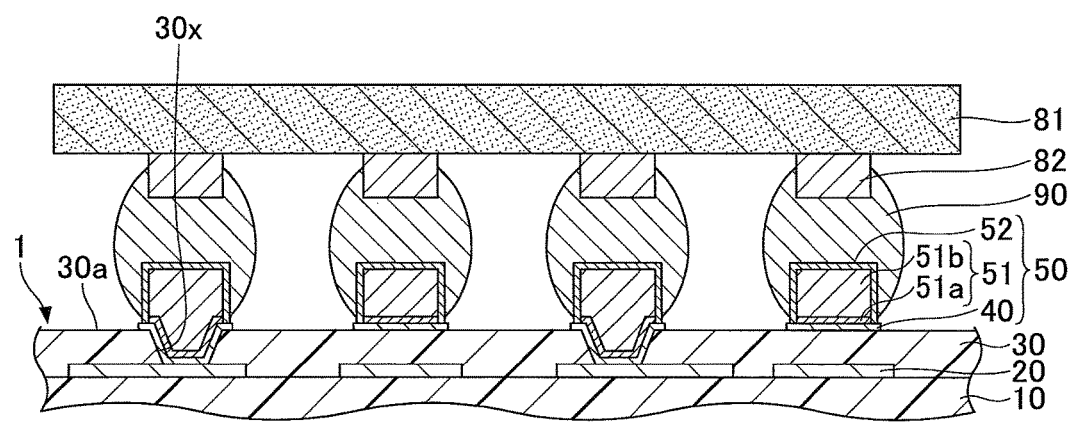

As illustrated in FIG. 5C, a semiconductor chip 81 formed with an electrode terminal 82 may be mounted on the wiring substrate 1 by, for example, a reflow process after performing the process of FIG. 5B. The connection terminal 50 of the wiring substrate 1 and the electrode terminal 82 of the semiconductor chip 81 may be bonded to each other by way of, for example, a solder bump 90.

For example, the material of the solder bump 90 may be tin (Sn), an alloy including tin (Sn) and silver (Ag), an alloy including tin (Sn) and copper (cu), an alloy including tin (Sn) and bismuth (Si), or an alloy including tin (Sn), silver (Ag), and copper (Cu).

In the wiring substrate 1, the connection terminal 50 protrudes from the upper surface 30a of the insulating layer 30. Therefore, solder is not applied to the connection terminal 50 but only to the electrode terminal 82 of the semiconductor chip 81. By solidifying the melted solder applied to the electrode terminal 82, the solder bump 90 can be formed.

In forming the solder bump 90, titanium (Ti) which is one of the materials included the metal layer 40 exhibits a low affinity not only with respect to nickel but also with respect to the solder material included in the solder bump 90. Therefore, by exposing the upper surface outer edge part W of the metal layer 40, the solder material included in the solder bump 90 is repelled and prevented from flowing to an adjacent connection terminal 50. Thereby, short-circuiting between adjacent connection terminals 50 can be prevented.

In the above-described first embodiment, the metal layer 40 including a material that is inactive with respect to a material included in the surface plating layer 52 is disposed between the insulating layer 30 and the surface plating layer 52. Thereby, the surface plating layer 52 is restrained from being deposited on the surface of the metal layer 40. As a result, the surface plating layer 52 is prevented from protruding on the upper surface 30a of the insulating layer 30.

Further, a material used for the metal layer 40 is inactive with respect to the surface plating layer 52 and has low affinity with respect to the solder material formed on the connection terminal 50. Using such material, the upper surface outer edge part W of the metal layer 40 is exposed. Thereby, a solder material used for connecting the wiring substrate 1 to a semiconductor chip or the like is prevented from flowing to an adjacent connection terminal 50 in a case of mounting the semiconductor chip or the like on the wiring substrate 1. Thus, short-circuiting between adjacent connection terminals 50 can be prevented.

If only a side surface of the metal layer 40 were to be exposed, it would be difficult to restrain the flowing of solder merely by exposing the side surface of the metal layer having only a nanometer-unit thickness. This may lead to short-circuiting between the bottom hems of adjacent connection terminals 50. Therefore, as described above in the first embodiment, it is preferable to expose the upper surface outer edge part W of the metal layer 40.

In the process illustrated in FIG. 4C, the portion of the metal layer 40 that is not covered by the metal post 51 need not be entirely removed. Alternatively, the amount of etching the metal layer 40 may be controlled so that the upper surface outer edge part W of the metal layer 40 remaining on the outside from the side surface of the metal post 51 forms a ring shape in a plan view. That is, the portion of the metal layer 40 at the outer side of the metal post 51 is removed at a slower etching rate compared to other portions of the metal layer 40. Therefore, as the etching progresses, first, the metal layer 40 formed between adjacent metal posts 51 is removed, and lastly, the portion of the metal layer 40 at the outer side of the metal post 51 is removed.

Thus, by stopping the etching after the removal of the portion of the metal layer 40 between adjacent metal posts 51 but before removing the portion of the metal layer 40 at the outer side of the metal post 51, the metal layer 40 can formed into the same shape as the metal layer 40 of FIG. 5A in the process of FIG. 4C. That is, the upper surface outer edge part W of the metal layer 40 at the outside from the side surface of the metal post 51 becomes exposed in a ring shape in a plan view. Because the process of FIG. 5A can be omitted by this method, the manufacturing of the wiring substrate 1 can be simplified. Thus, manufacturing cost of the wiring substrate 1 can be reduced.

First Working Example

To confirm the effect of the first embodiment, the wiring substrate 1 was fabricated based on the processes described with FIG. 3A to FIG. 5B. In the first working example, titanium was used as the material of the metal layer 40, and copper was used as the material of the metal post 51. Further, a Ni/Pd/Au layer was formed as the surface plating layer 52 by using an electroless plating method.

Figure 6A:
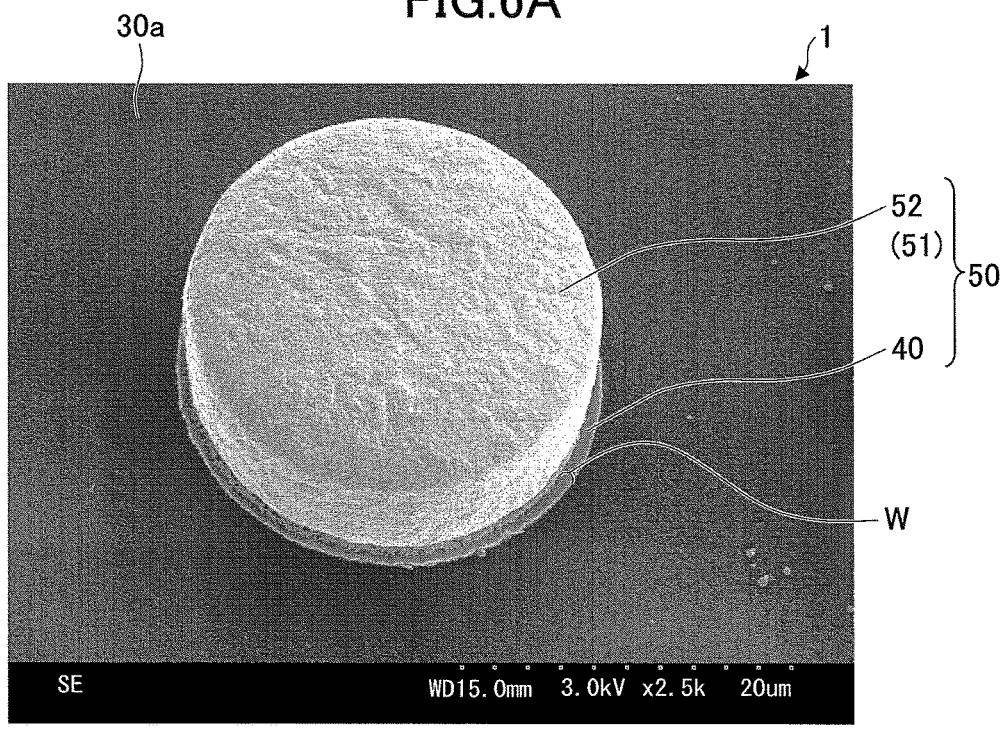
FIGS. 6A and 6B are microscopic photographs illustrating a part of a wiring substrate manufactured according by a first working example.
Figure 6B:
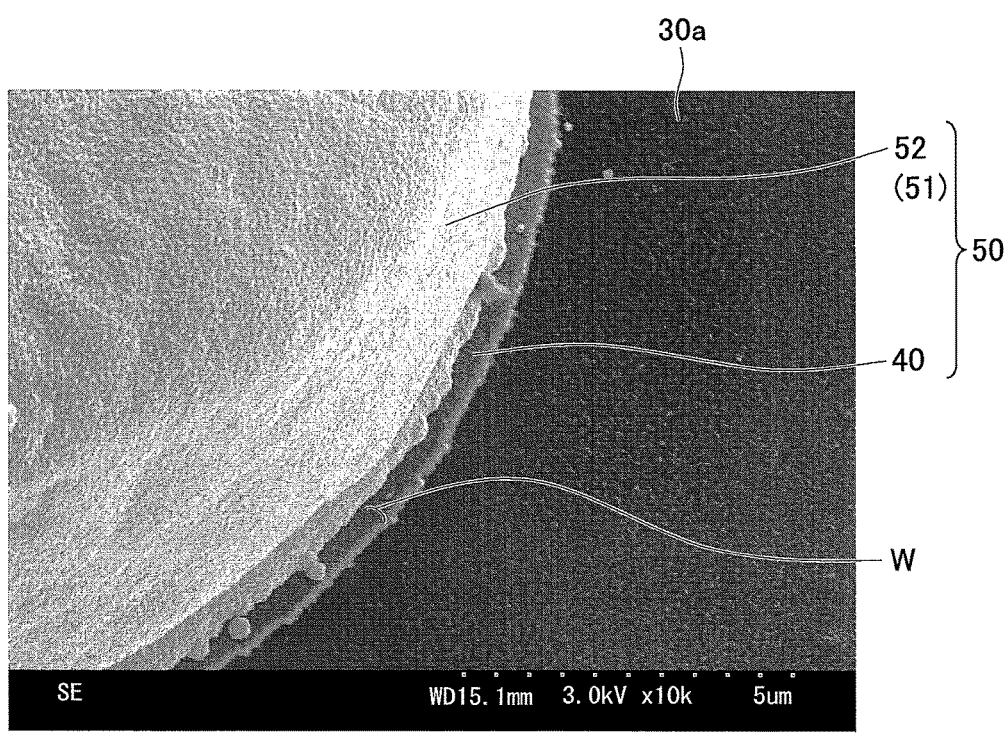

FIGS. 6A and 6B are microscopic photographs illustrating a portion of a wiring substrate fabricated in the first working example. As illustrated in FIG. 6A, the metal post 51 and the surface plating layer 52 are formed on the metal layer 40 in the connection terminal 50 of the wiring substrate 1. It can be confirmed that the upper surface edge part W of the metal layer 40 is exposed in a ring shape at the outside of the side surface of the surface plating layer 52 in a plan view.

FIG. 6B is an enlarged microscopic photograph of FIG. 6A. Because the metal layer 40 is inactive with respect to the material included in the surface plating layer 52, the surface plating layer 52 is restrained from being deposited on the surface of the metal layer 40. Therefore, as illustrated in FIG. 6B, although the surface plating layer 52 is sparsely deposited on the surface of the metal layer 40, the surface plating layer 52 is prevented from being grown as a continuous film on the surface of the metal layer 40.

To confirm that the surface plating layer 52 is prevented from growing as a continuous film on the surface of the metal layer 40, the following experiment was performed. First, copper foils were formed on both surfaces of a wiring substrate. Further, a titanium film corresponding to the metal layer 40 was formed on the copper foil on one of the surfaces of the wiring substrate. Then, an electroless nickel plating process was performed on both surfaces of the wiring substrate. As a result, a nickel film having a few μm-thickness was formed on the copper foils. Although an extremely small amount of nickel film was sparsely deposited on the titanium film, no continuous film of nickel was formed on the titanium film. The reason that an extremely small amount of nickel film was sparsely deposited on the titanium film is because a slight amount of a catalyst (e.g., palladium) which causes depositing of the electroless nickel plating was trapped on the titanium film and resulted in nickel being deposited on that portion of the titanium film.

Hence, it was confirmed that the bottom hem of the surface plating layer 52 is prevented from extending (protruding) to an adjacent connection terminal 50 on the upper surface 30a of the insulating layer 30 by disposing the metal layer 40 between the insulating layer 30 and the surface plating layer 52. It was also confirmed that the occurrence of short-circuiting of solder bumps is reduced.

First Modified Example of First Embodiment

In the first modified example of the first embodiment, a surface plating layer is thickly formed compared to surface plating layer 50 of the above-described first embodiment. In the first modified example of the first embodiment, like components/parts are denoted with like reference numerals as those of the first embodiment and are not further explained.

Figure 7A:
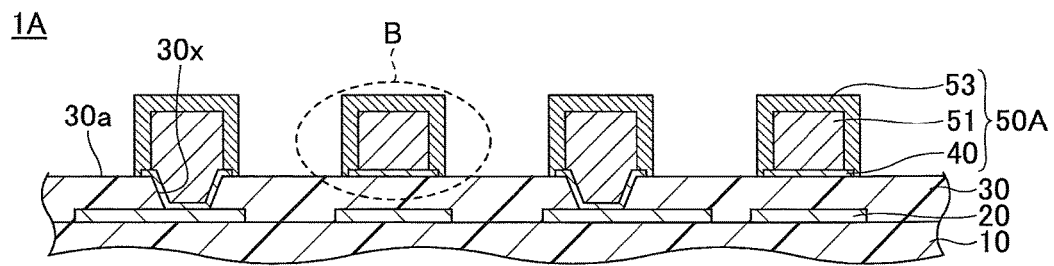
FIGS. 7A and 7B are schematic diagrams illustrating a part of a wiring substrate according to a first modified example of the first embodiment of the present invention.
Figure 7B:
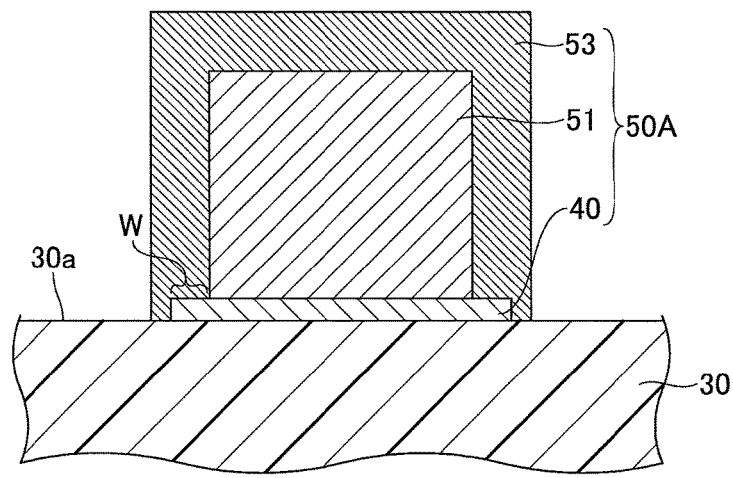

FIGS. 7A and 7B are cross-sectional views of a portion of a wiring substrate 1A of the first modified example of the first embodiment. FIGS. 7A and 7B illustrate the vicinity of an insulating layer 30 that is to be an outermost insulating layer of the wiring substrate 1A on one side of the wiring substrate 1A. FIG. 7B is an enlarged view of area B illustrated in FIG. 7A. As illustrated in FIGS. 7A and 7B, the wiring substrate 1A is different from the wiring substrate 1 (see FIGS. 1A and 1B) in that the connection terminal 50 is replaced by a connection terminal 50A.

The connection terminal 50A is a projecting electrode that is formed to project from an upper surface 30a of the insulating layer 30. The connection terminal 50 can be electrically connected to an electronic component such as a semiconductor chip. The connection terminal 50A includes the metal layer 40, the metal post 51 formed on the upper surface of the metal layer 40 as the body of the connection terminal 50A, and a surface plating layer 53 covering the upper and side surfaces of the metal post 51.

Similar to the connection terminal 50, the metal layer 40 of the connection terminal 50A has an upper surface outer edge part W exposed in a ring shape at the outside from the side surface of the metal post 51 in a plan view. The surface plating layer 53 is formed to cover the entire upper surface outer edge part W of the metal layer 50 in a plan view. That is, the film thickness of the surface plating layer 53 is greater than the width of the upper surface outer edge part W of the metal layer 40. Further, the surface plating layer 53 is formed to cover a side surface of the metal layer 40. The surface plating layer 53 may have, for example, the same layer configuration as the above-described surface plating layer 52.

However, as described above, the metal layer 40 is to be inactive with respect to a material included in the surface plating layer 53, so that the surface plating layer 53 is restrained from being deposited on the surface of the metal layer 40. Thus, although the surface plating layer 53 may be deposited on parts of the surface of the metal layer 40, the surface plating layer 53 cannot continuously grow on the surface of the metal layer 40.

For the sake of convenience, FIG. 7B illustrates the upper surface outer edge part W of the metal layer 40 and the side surface of the metal layer 40 continuously contacting an end part of the surface plating layer 53. However, when viewed in units of microns, the upper surface outer edge part W of the metal layer 40 and the side surface of the metal layer 40 partly (sparsely) contact the end part of the surface plating layer 53. That is, the upper surface outer edge part W of the metal layer 40 and the side surface of the metal layer 40 do not continuously contact the end part of the surface plating layer 53. In other words, fine cavities are formed in the areas where the upper surface outer edge part W and the side surface of the metal layer 40 face the end part of the surface plating layer 53. Therefore, the adhesive strength between the metal layer 40 and the surface plating layer 53 is significantly less than the adhesive strength between the metal post 51 and the surface plating layer 53.

Although FIGS. 7A and 7B illustrate the surface plating layer 53 being provided in the vicinity of the side surface of the metal layer 40, the surface plating layer 53 is not grown as a continuous film from the upper and side surface of the metal layer 40. As described above in comparison with the comparative example of FIG. 2, the metal layer 40 including a material that is inactive with respect to the material included in the surface plating layer 53 is disposed between the insulating layer 30 and the surface plating layer 53. Thereby, in addition to restraining the surface plating layer 53 from being deposited on the upper and side surfaces of the metal layer 40, the surface plating layer 53 can be thickly deposited on the upper and side surfaces of the metal post 51. That is, even in a case where the surface plating layer 53 is thickly deposited on the upper and side surfaces of the metal post 51, the surface plating layer 53 is restrained from having the same thickness as the thicknesses of the upper and side surfaces of the metal post 51 on the upper and side surfaces of the metal layer 40.

Therefore, the bottom hem of the surface plating layer 53 can be prevented from extending (protruding) on the upper surface 30a of the insulating layer 30. As a result, similar to the wiring substrate 1 of the first embodiment, the wiring substrate 1A according to the first modified example of the first embodiment enables the pitch of the connection terminals 50A to be further reduced compared to the wiring substrate 1X of the comparative example.

Further, unlike the surface plating layer 52 of the first embodiment, the film thickness of the surface plating layer 53 need not be precisely controlled to be less than the upper surface outer edge part W exposed to form a ring shape at the outside from the side surface of the metal post 51 in a plan view. Therefore, the surface plating layer 53 can be formed more easily compared to the surface plating layer 52.

Second Working Example

To confirm the effect of the first modified example of the first embodiment, the wiring substrate 1A was fabricated based on the processes described with FIG. 3A to FIG. 5B. However, in the process of FIG. 5B, the surface plating layer 53 was formed to have a greater film thickness than the upper surface outer edge part W of the metal layer 40 exposed to form a ring shape at the outside from the side surface of the metal post 51 in a plan view. In the second working example, titanium was used as the material of the metal layer 40, and copper was used as the material of the metal post 51. Further, a Ni/Au layer was formed as the surface plating layer 53 by using an electroless plating method.

Figure 8:
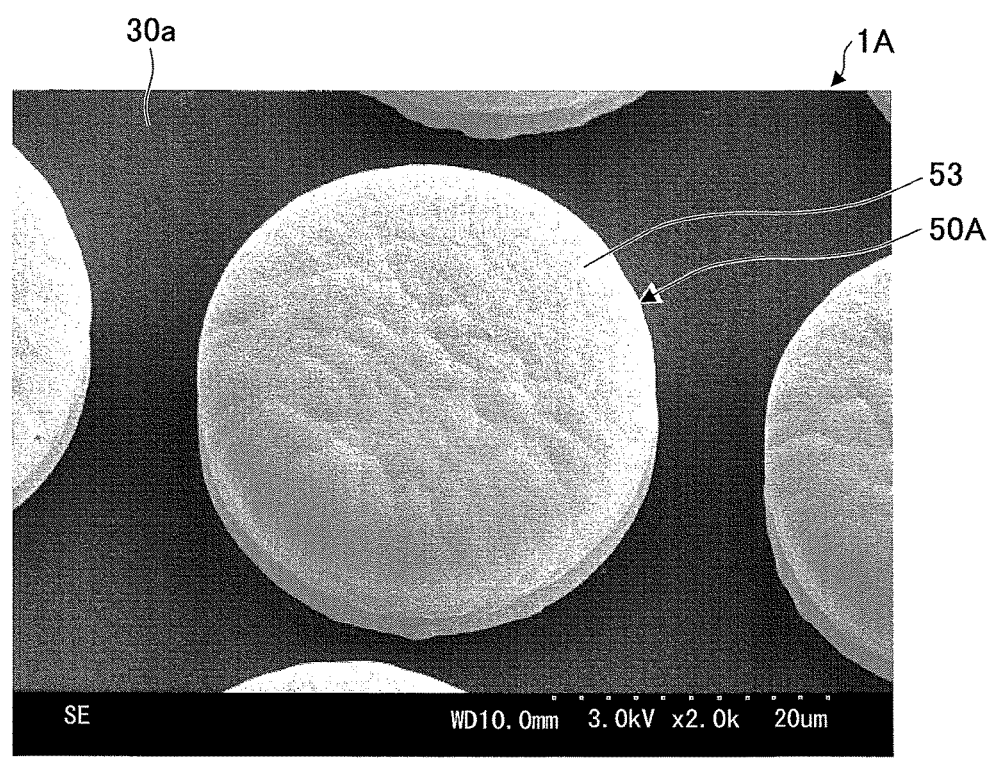
FIG. 8 is a microscopic photograph illustrating a part of a wiring substrate manufactured according to a second working example.

FIG. 8 is a microscopic photograph illustrating a portion of a wiring substrate fabricated in the second working example. As illustrated in FIG. 8, it was confirmed that the bottom hem of the surface plating layer 53 is prevented from extending (protruding) to an adjacent connection terminal 50A on the upper surface 30a of the insulating layer 30 by disposing the metal layer 40 between the insulating layer 30 and the surface plating layer 53.

Second Modified Example of First Embodiment

In the second modified example of the first embodiment, a connection terminal is formed on a projecting part of an insulating layer. In the second modified example of the first embodiment, like components/parts are denoted with like reference numerals as those of the first embodiment and are not further explained.

Figure 9A:
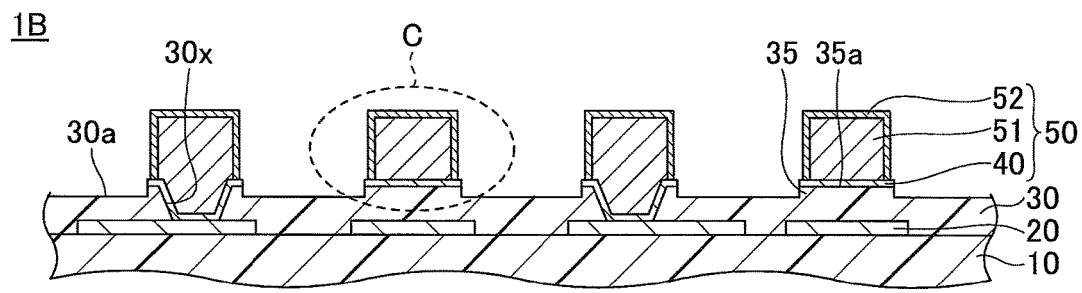
FIGS. 9A and 9B are schematic diagrams illustrating a part of a wiring substrate according to a second modified example of the first embodiment of the present invention.
Figure 9B:
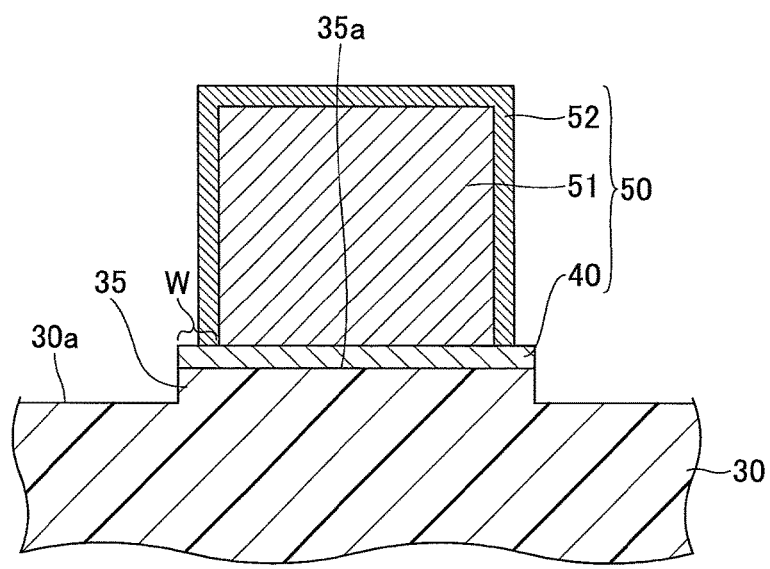

FIGS. 9A and 9B are cross-sectional views of a portion of a wiring substrate 1B of the second modified example of the first embodiment. FIGS. 9A and 9B illustrate the vicinity of an insulating layer 30 that is to be an outermost insulating layer of the wiring substrate 1B on one side of the wiring substrate 1B. FIG. 7B is an enlarged view of area C illustrated in FIG. 9A. As illustrated in FIGS. 9A and 9B, the wiring substrate 1B is different from the wiring substrate 1 (see FIGS. 1A and 1B) in that a projecting part 35 is provided on the upper surface 30a of the insulating layer 30. The projecting part 35 is a part of the insulating layer 30 and is integrally formed with other parts of the insulating layer 30. It is to be noted that this second modified example of providing the projecting part 35 can be applied not only to the above-described first embodiment but also to the first modified example of the first embodiment.

The connection terminal 50 is formed on an upper surface 35a of the projecting part 35. The metal layer 40 included in the connection terminal 50 is formed in a position superposing the upper surface 35a of the projecting part 35. That is, the side surface of the metal layer 40 and the side surface of the projecting part 35 are flush. Thus, there is no difference in level between the side surface of the metal layer 40 and the side surface of the projecting part 35. The amount in which the projecting part 35 projects from the upper surface 30a of the insulating layer 30 (i.e., height of the upper surface 35a of the projecting part 35 from the upper surface 30a of the insulating layer 30) may be, for example, approximately 0.5 μm to 1 μm.

In fabricating the wiring substrate 1B, first, the same processes performed in FIGS. 3A-4B of the first embodiment are performed. Then, in the process illustrated in FIG. 10A, a portion of the metal layer 40 that is not covered by the metal post 51 is removed by etching. Unlike the wet-etching performed in the first embodiment, a dry process (in this example, plasma process) is performed to remove the metal layer 40.

In addition to removing the portion of the metal layer 40 that is not covered by the metal post 51, a surface of the insulating layer 30 that is not covered by the metal post 51 is also removed by etching. Thereby, the projecting part 35 is formed on the upper surface 30a of the insulating layer 30. As a result, a structure having the metal layer 40 etc., formed on the upper surface 35a of the projecting part 35 is obtained. At this stage illustrated in FIG. 10A, the side surface of the electroplating layer 51b, the side surface of the seed layer 51a, and the side surface of the metal layer 40, and the side surface of the projecting part 35 are flush. Thus, there is no difference in level among the side surfaces of the electroplating layer 51b, the seed layer 51a, the metal layer 40, and the projecting part 35.

Figure 10A:
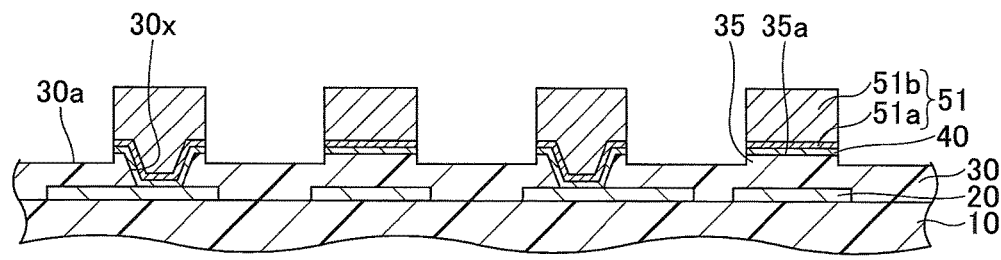
FIGS. 10A-10C are schematic diagrams illustrating processes for manufacturing the wiring substrate according to the second modified example of the first embodiment of the present invention.
Figure 10B:
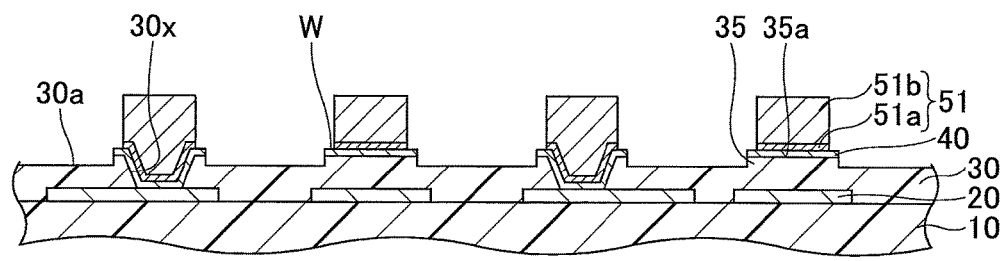

Then, similar to the process of FIG. 5A, the periphery of the metal post 51 is etched approximately 0.2 μm to 3 μm in the process illustrated in FIG. 10B. Thereby, the upper surface outer edge part W having a ring shape is exposed at the outside from the side surface of the metal post 51 in a plan view.

Figure 10C:
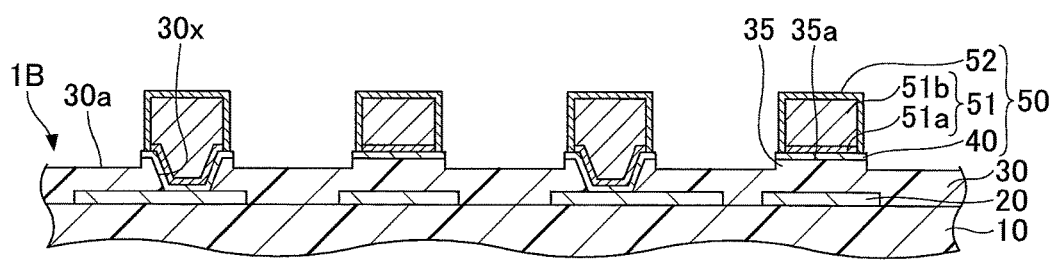

Then, similar to the process of FIG. 5B, the surface plating layer 52 covers the upper and side surfaces of the metal post 51 in the process illustrated in FIG. 10C. Thereby, the connection terminal 50 including the metal layer 40, the metal post 51 (including the seed layer 51a and the electroplating layer 51b), and the surface plating layer 52 is formed on the upper surface 35a of the projecting part 35. Thereby, the manufacturing of the wiring substrate 1B is completed.

Hence, in the above-described second modified example of the first embodiment, the connection terminal 50 including the metal layer 40 is formed on the upper surface 35a of the projecting part 35 provided on the upper surface 30a of the insulating layer 30. Similar to the first embodiment, the surface plating layer 52 can be prevented from protruding on the upper surface 30a of the insulating layer 30 owing to the effect of providing the metal layer 40 between the insulating layer 30 and the surface plating layer 52. Further, an additional effect can be attained by providing the projecting part 35. That is, even if a portion of the surface plating layer 52 protrudes to some degree, it would be difficult for the portion of the surface plating layer 52 to reach another adjacent connection terminal 50 because the portion of the surface plating layer 52 accumulates at the upper surface 30a of the insulating layer 30a that is positioned lower than the projecting part 35. Thereby, the risk of short-circuiting between adjacent connection terminals 50 can be further reduced.

In the wiring substrate 1B, the via hole 30x may be formed directly below each connection terminal 50, so that each connection terminal 50 is directly connected to the wiring layer 20 provided directly below the wiring layer 30 by way of the via hole 30x. In this case, the pitch of adjacent connection terminals 50 can be further reduced because no routing wiring is required to be formed on the upper surface 30a of the insulating layer 30. Thereby, high densification can be achieved.

Third Working Example

The wiring substrate 1B according to the second modified example of the first embodiment was fabricated based on the processes described with FIG. 10A to FIG. 10C. In the third working example, titanium was used as the material of the metal layer 40, and copper was used as the material of the metal post 51. Further, a Ni/Au layer was formed as the surface plating layer 52 by using an electroless plating method.

Figure 11:
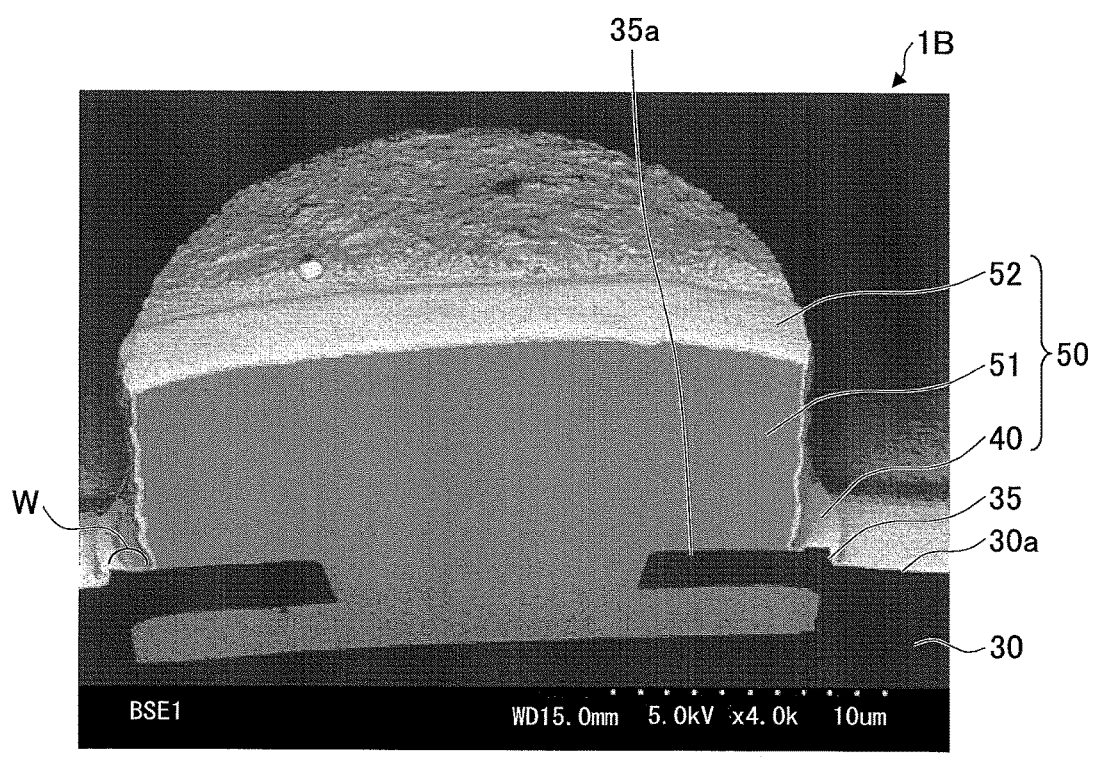
FIG. 11 is a microscopic photograph illustrating a part of a wiring substrate manufactured according to a third working example.

FIG. 11 is a microscopic photograph illustrating a portion of a wiring substrate fabricated in the third working example. As illustrated in FIG. 11, it can be confirmed that the projecting part 35 is provided on the upper surface 30a of the insulating layer 30 and that the connection terminal 50 including the metal layer 40 is formed on the upper surface 35a of the projecting part 35.

Various aspects of the subject-matter described herein are set out non-exhaustively in the following numbered clauses:

1. A method for manufacturing a wiring substrate, the method comprising:
   forming a connection terminal on an insulating layer;
   wherein the forming of the connection terminal includes
   forming a metal layer including an upper surface on the insulating layer,
   forming a metal post including upper and side surfaces on the upper surface of the metal layer, and
   forming a surface plating layer covering the upper and side surfaces of the metal post,
   wherein the metal layer includes a material that is inactive with respect to a material included in the surface plating layer, and
   wherein the forming of the connection terminal includes
   forming the metal layer to have an upper surface edge part that is exposed at an outside from the side surface of the metal post in a plan view, and
   forming the surface plating layer exposing the upper surface edge part of the metal layer from the plan view.
2. The method of clause 1,
   wherein the forming the metal layer includes forming the metal layer on an entire upper surface of the insulating layer,
   wherein the forming of the connection terminal includes
   selectively forming the metal post on the metal layer, and
   etching the metal layer at the outside from the side surface of the metal post in the plan view, and
   wherein the etching of the metal layer includes controlling an amount of etching the metal layer so that an outer edge of the metal layer remains at the outside from the side surface of the metal post in the plan view.
3. The method of clause 1,
   wherein the forming the metal layer includes forming the metal layer on an entire upper surface of the insulating layer,
   wherein the forming of the connection terminal includes
   selectively forming the metal post on the metal layer, and
   etching the metal layer at the outside from the side surface of the metal post in the plan view, and
   wherein the etching of the metal layer includes forming a projecting part in the insulating layer by etching the metal layer at the outside from the side surface of the metal post and a surface of the insulating layer at the outside from the side surface of the metal post.
4. A method for manufacturing a wiring substrate, the method comprising:
   forming a connection terminal on an insulating layer;
   wherein the forming of the connection terminal includes
   forming a metal layer including upper and side surfaces on the insulating layer,
   forming a metal post including upper and side surfaces on the upper surface of the metal layer, and
   forming a surface plating layer covering the upper and side surfaces of the metal post,
   wherein the metal layer includes a material that is inactive with respect to a material included in the surface plating layer, and
   wherein the forming of the connection terminal includes
   forming the metal layer to have an upper surface edge part that is exposed at an outside from the side surface of the metal post in a plan view, and
   forming the surface plating layer that covers the upper surface edge part and the side surface of the metal layer in the plan view.
5. The method of clause 4,
   wherein the forming the metal layer includes forming the metal layer on an entire upper surface of the insulating layer,
   wherein the forming of the connection terminal includes
   selectively forming the metal post on the metal layer, and
   etching the metal layer at the outer side of the metal post from the plan view, and
   wherein the etching of the metal layer includes controlling an amount of etching the metal layer so that an outer edge of the metal layer remains at the outside from the side surface of the metal post in the plan view.
6. The method of clause 4,
   wherein the forming the metal layer includes forming the metal layer on an entire upper surface of the insulating layer, wherein the forming of the connection terminal includes selectively forming the metal post on the metal layer, and etching the metal layer at the outside from the side surface of the metal post from the plan view, and wherein the etching of the metal layer includes forming a projecting part in the insulating layer by etching the metal layer at the outside from the side surface of the metal post and a surface of the insulating layer at the outside from the side surface of the metal post.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:

an insulating layer; and a connection terminal formed on the insulating layer;

wherein the connection terminal includes a metal layer formed on the insulating layer and including an upper surface, a metal post formed on the upper surface of the metal layer and including upper and side surfaces, and a surface plating layer that covers the upper and side surfaces of the metal post, wherein the metal layer includes a material that is inactive with respect to a material included in the surface plating layer, wherein the metal layer has an upper surface edge part that is exposed at an outside from the side surface of the metal post in a plan view, wherein the surface plating layer is formed to expose the upper surface edge part of the metal layer, and wherein a space or spaces are formed in an area where an inner peripheral surface of the upper surface edge part and an end part of a surface of the surface plating layer face other.

2. The wiring substrate as claimed in claim 1, wherein the metal layer is formed of a material that has a lower affinity with respect to solder compared to the surface plating layer.

3. The wiring substrate as claimed in claim 1, wherein an adhesive strength between the metal post and the surface plating layer is greater than an adhesive strength between the metal layer and the surface plating layer.

4. The wiring substrate as claimed in claim 1, wherein the insulating layer includes a projecting part, and wherein the connection terminal is formed on the projecting part.

5. A wiring substrate comprising:

an insulating layer; and a connection terminal formed on the insulating layer;

wherein the connection terminal includes a metal layer formed on the insulating layer and including upper and side surfaces, a metal post formed on the upper surface of the metal layer and including upper and side surfaces, and a surface plating layer that covers the upper and side surfaces of the metal post, wherein the metal layer includes a material that is inactive with respect to a material included in the surface plating layer, wherein the metal layer has an upper surface edge part that is exposed at an outside from the side surface of the metal post in a plan view, wherein the surface plating layer is formed to cover the upper surface edge part and the side surface of the metal layer and wherein a space or spaces are formed in an area where an inner peripheral surface of the upper surface edge part and an end part of a surface of the surface plating layer face other.

6. The wiring substrate as claimed in claim 5, wherein the metal layer is formed of a material that has a lower affinity with respect to solder compared to the surface plating layer.

7. The wiring substrate as claimed in claim 5, wherein an adhesive strength between the metal post and the surface plating layer is greater than an adhesive strength between the metal layer and the surface plating layer.

8. The wiring substrate as claimed in claim 5, wherein the insulating layer includes a projecting part, and wherein the connection terminal is formed on the projecting part.

* * * * *